(12) United States Patent
Mine et al.

(10) Patent No.: US 7,208,964 B2
(45) Date of Patent: Apr. 24, 2007

(54) PROBE CARD

(75) Inventors: Atsushi Mine, Arao (JP); Toranosuke Furusho, Arao (JP); Kazumichi Machida, Takarazuka (JP); Atsuo Urata, Ibaraki (JP); Teppei Kimura, Kobe (JP); Teruhisa Sakata, Kikuchi-gun (JP)

(73) Assignee: Nihon Denshizairyo Kabushiki Kaisha, Amagasaki-Shi (JP)

( * ) Notice: Subject to any disclaimer, the term of this patent is extended or adjusted under 35 U.S.C. 154(b) by 0 days.

(21) Appl. No.: 10/709,435

(22) Filed: May 5, 2004

(65) Prior Publication Data

US 2005/0099194 A1   May 12, 2005

(30) Foreign Application Priority Data

Nov. 7, 2003   (JP)   ............... 2003-378522

(51) Int. Cl.
*G01R 31/00* (2006.01)
*G01R 31/02* (2006.01)
*G01R 31/28* (2006.01)

(52) U.S. Cl. .................. 324/754; 324/763; 324/765; 257/739

(58) Field of Classification Search ........ 324/750–765; 257/739
See application file for complete search history.

(56) References Cited

U.S. PATENT DOCUMENTS

| | | | | |
|---|---|---|---|---|
| 5,225,037 A | 7/1993 | Elder et al. | ................. | 156/644 |
| 5,476,211 A | 12/1995 | Khandros | ................ | 228/180.5 |
| 5,977,783 A * | 11/1999 | Takayama et al. | .......... | 324/754 |
| 6,307,392 B1 | 10/2001 | Socjima et al. | ............. | 324/762 |
| 6,496,023 B1 | 12/2002 | Kanamaru et al. | .......... | 324/754 |
| 6,628,127 B2 * | 9/2003 | Takemoto et al. | .......... | 324/754 |
| 6,633,176 B2 * | 10/2003 | Takemoto et al. | .......... | 324/754 |
| 6,680,536 B2 * | 1/2004 | Hattori et al. | .............. | 257/739 |
| 6,741,086 B2 * | 5/2004 | Maekawa et al. | ............ | 324/754 |
| 2003/0034782 A1 | 2/2003 | Hirano et al. | ................ | 324/500 |

FOREIGN PATENT DOCUMENTS

| | | |
|---|---|---|
| GB | 2 383 474 A | 6/2003 |
| JP | 07-209334 | 8/1995 |
| JP | 11-326381 | 11/1999 |
| JP | 2001-41978 | 2/2001 |

* cited by examiner

*Primary Examiner*—Ha Tran Nguyen
*Assistant Examiner*—Emily Y Chan
(74) *Attorney, Agent, or Firm*—Armstrong, Kratz, Quintos, Hanson & Brooks, LLP.

(57) ABSTRACT

It is an object of the present invention to provide an arch type probe capable of enduring a load caused by overdriving even if the probe is miniaturized, and a probe card using the same. An arch type probe 200 has a shape including a first quarter circle arc portion 210 which is supported at one end thereof by the base plate 100 and a second quarter circle arc portion 220 which is connected to the other end of the first quarter circle arc portion 210, extending toward the base plate and a little shorter than the first quarter circle arc portion 221. The top portion of the arch type probe 200 serves as a contact surface brought into contact with an electrode of a semiconductor wafer B.

8 Claims, 4 Drawing Sheets

PROBE CARD

BACKGROUND OF THE INVENTION

1. Field of the Invention

The present invention relates to a probe used in measurement of electric characteristics of a measurement objective, and a probe card using the same.

2. Prior Art

There has been available a probe card of this kind having needle-like probes brought into contact with electrodes of a measurement objective and a base plate on which the probes are provided, wherein the probes are brought into contact with the electrodes, thereafter pressed against them (overdriven), thereby securing a predetermined contact pressure of the probes, while on the other hand, the probes are caused to slide on surfaces of the electrodes sideways (scrubbing is caused to occur), thereby realizing electric conduction between the probes and the electrodes (see Patent literature 1).

Patent literature 1 is JP-A No. 2001-41978.

In a probe card, a measurement objective in the recent years has been advanced in complexity in an integrated circuit thereof (a pitch of electrodes thereof have been narrowed), in company with which probes are miniaturized and a necessity arises for providing the probes at a narrow pitch on a base plate.

If a needle-like probe is miniaturized, however, the probe cannot endure a load caused by overdriving and is broken. This causes advancement in complexity in a integrated circuit of a measurement objective to be difficult.

SUMMARY OF THE INVENTION

The present invention has been created in light of such circumstances and it is an object of the present invention to provide an arch type probe capable of enduring a load caused by overdriving even if the probe is miniaturized, and a probe card using the same.

In order to solve the above problem, an arch type probe of the present invention is a probe in the shape of a half circle arc, formed on and supported at one end thereof by a surface of a base plate of a probe card, having a first quarter circle arc portion which is supported at one end thereof by the base plate and a second quarter circle arc portion connected to the other end of the first quarter circle arc portion and a little shorter than the first quarter circle arc portion, wherein the top portion of the probe located at almost the center of the probe serves as a contact surface brought into contact with an electrode of a measurement objective.

It is desirable to provide a projected contact terminal at the top portion of the probe. The distal end portion of the second quarter circle arc portion of the probe can be spherical. Instead of the spherical distal end portion, the distal end surface of the distal end portion of the second quarter circle arc portion may be applied with coating. It is possible for a material necessary for raising a Young's modulus to be incorporated in the probe.

A probe card of the present invention is a probe card, which is a sensing section of a measurement objective measuring instrument, having a base plate mounted to a prober of the instrument and arch type probes formed on a surface of the base plate.

Coating can be applied on a portion of the distal end surface of the second quarter circle arc portion, which portion is in contact with and on a surface of the base plate.

A reinforcing member with an elasticity higher than the arch type probe may be provided integrally with the arch type probe on a surface thereof opposite the base plate along the length direction. Alternatively, a reinforcing member with an elasticity higher than the arch type probe may be provided between the base plate and a surface of the arch type probe on the other side of the arch type probe from the top portion of the arch type probe.

In a case where an arch type probe related to Claim 1 of the present invention is adopted, the top portion of the probe formed in the shape of a hall circle arc is caused to be in contact with an electrode of a measurement objective and thereafter, overdriving is effected, whereby the probe is elastically deformed, in parallel thereto the distal end portion of the second quarter circle arc portion is brought into contact with a surface of a base plate and in this state, moves on the surface of the base plate sideways (that is slides); therefore, enabling a load caused by overdriving to be dispersed. Accordingly, there is no chance that the probe is broken, which occurs in a conventional example. Since the distal end portion of the second quarter circle arc portion is brought into contact with the base plate, it is also possible to secure a predetermined contact pressure necessary for achieving electric conduction between the probe and an electrode and by sliding the distal end portion of the second quarter circle arc on a surface of the base plate in contact with the base plate to in turn, cause the top portion of the probe to slide on an electrode of the measurement objective, it is also possible to secure a predetermined scrubbing distance. As a result, it is possible to miniaturize an arch type probe, thereby enabling adaptation for a measurement object with an advanced complexity in an integrated circuit.

In a case where an arch type probe related to Claim 2 of the present invention is adopted, a contact terminal brought into contact with an electrode of a measurement object is provided at the top portion of the probe; therefore, enabling contact with an electrode to be ensured with certainty.

In a case where an arch type probe related to Claim 3 of the present invention is adopted, the distal end portion of the second quarter circle arc portion of the probe is spherical; therefore, decreasing a friction coefficient between the distal end portion of the second quarter circle arc portion of the probe and the base plate. As a result, the distal end portion of the second quarter circle arc portion slides sideways with ease in contact with a surface of the base plate, therefore, enabling a load caused by overdriving to be dispersed more.

In a case where an arch type probe related to Claim 4 of the present invention is adopted, coating is applied on the distal end surface of the distal end portion of the second quarter circle arc portion; therefore, reduction occurs in a friction coefficient between the distal end portion of the second quarter circle arc portion of the probe and the base plate; thereby, as a result, an effect similar to that of Claim 3 can be obtained.

In a case where an arch type probe related to Claim 5 of the present invention is adopted, a material necessary for raising a Young's modulus is incorporated in the probe; therefore, enabling improvement on a strength of the probe. Accordingly, it is possible to miniaturize an arch type probe.

In a case where a probe card related to Claim 6 of the present invention is adopted, an effect similar to that of the arch type probe can be obtained.

In a case where a probe card related to Claim 7 of the present invention is adopted, coating is applied on a portion of a surface of the base plate in contact with the distal end surface of the second quarter circle arc portion; therefore, enabling reduction in friction coefficient between the base plate and the probe. As a result, the distal end portion of the second quarter circle arc portion slides sideways with ease in contact with a surface of the base plate, therefore, enabling a load caused by overdriving to be dispersed more.

In a case where a probe card related to Claim 8 of the present invention is adopted, a reinforcing member with an elasticity higher than the arch type probe is provided integrally with the arch type probe on a surface thereof opposite the base plate along the length direction; therefore, there is no chance that the probe is broken even if the probe is miniaturized, which occurs in a conventional example.

In a case where a probe card related to Claim 8 of the present invention is adopted, a reinforcing member with an elasticity higher than the arch type probe is provided between the base plate and a surface of the arch type probe on the other side thereof from the top portion thereof; therefore, enabling a load caused by overdriving to be dispersed more. Accordingly, there is no chance that the probe is broken even if the probe is miniaturized, which occurs in a conventional example.

DESCRIPTION OF THE PREFERRED EMBODIMENTS

Figure 1:
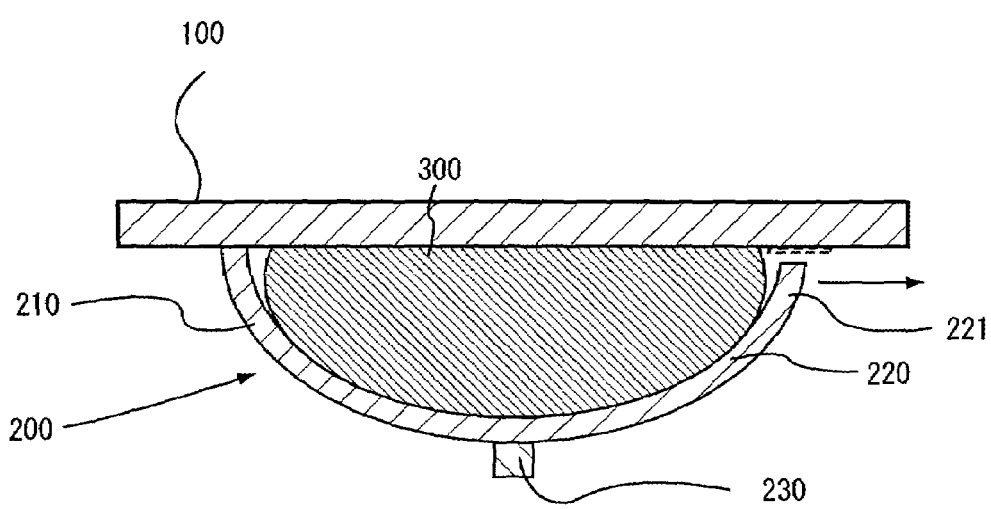
FIG. 1 is a model sectional view of a probe card using an arch type probe related to an embodiment of the present invention.
Figure 1:
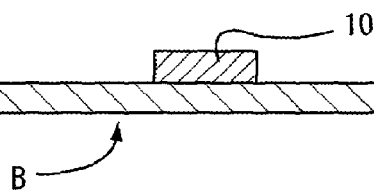
Figure 2:
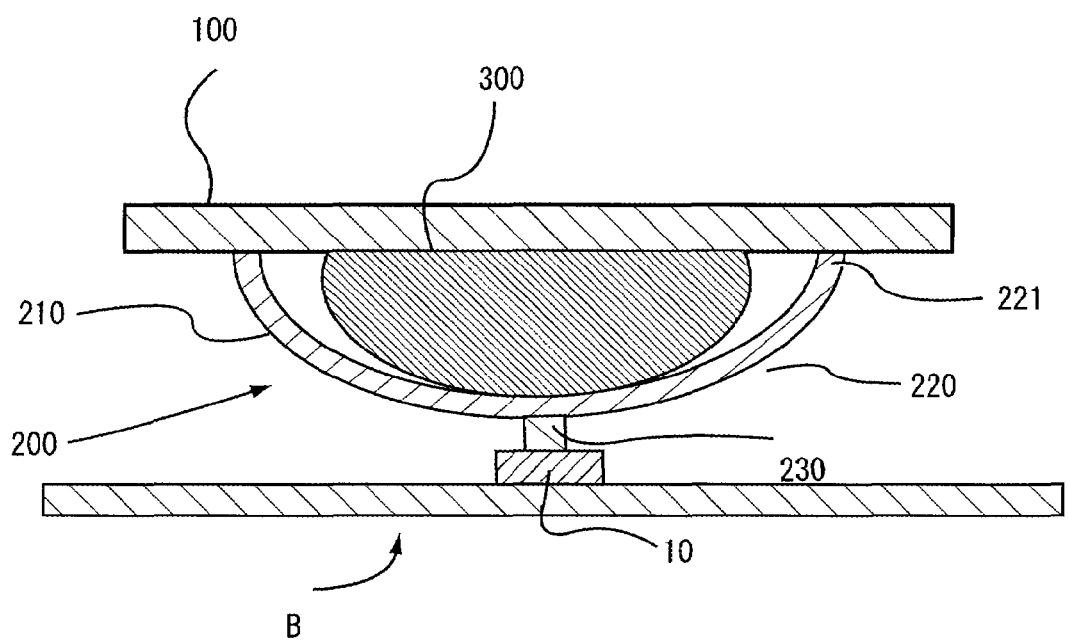
FIG. 2 is a model sectional view showing a usage state of the probe card.
Figure 3:
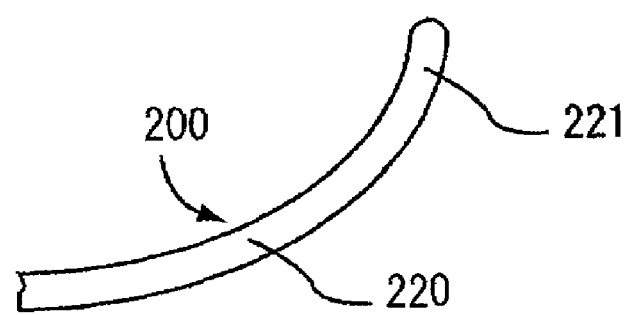
FIG. 3 is a model view of a second quarter circle arc portion of an arch type probe of the probe card, the distal end portion of which second quarter circle arc portion is spherical.
Figure 4:
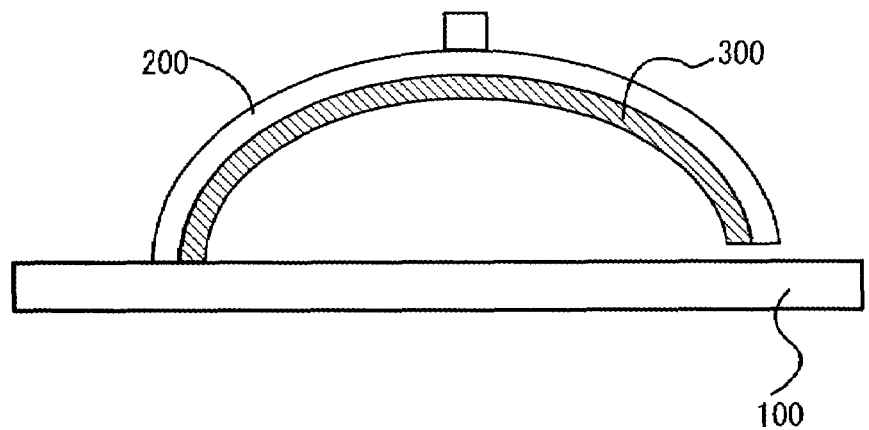
FIG. 4 is a model view for describing a reinforcing member for an arch type probe of the probe card, which member is different from the arch type probe.

Description will be given of a probe card using an arch type probe related to an embodiment of the present invention below. FIG. 1 is a model sectional view of a probe card using an arch type probe related to an embodiment of the present invention, FIG. 2 is a model sectional view showing a usage state of the probe card, FIG. 3 is a model view of a second quarter circle arc portion of an arch type probe of the probe card, the distal end portion of which second quarter circle arc portion is spherical and FIG. 4 is a model view for describing a reinforcing member for an arch type probe of the probe card, which member is different from the arch type probe.

A probe card A shown in FIG. 1 is a sensing section of a measuring instrument, not shown, for a measurement objective B and has a base plate 100 held by a prober of the measuring instrument, and thereby disposed opposite the measurement objective B and plural arch type probes 200 formed on a surface of the base plate 100. Detailed description will be given of constituents thereof below:

An arch type probe 200 is formed on a surface of the base plate 100 integrally with the surface thereof in the shape of a half circle arc in a procedure in which a resist is coated on the surface of the base plate to form patterns on the resist and to plate the surface thereof in conformity with the patterns, and such a process is repeated. A pitch of the arch type probes 200 is the same as that of electrodes 10 of a measurement objective B so that the arch type probes 200 can be brought into contact with the corresponding electrodes 10 of the measurement object B and in this case, the pitch is set at 25 µm.

An arch type probe 200 has a shape including a first quarter circle arc portion 210 which is supported at one end thereof by the base plate 100 and a second quarter circle arc portion 220 which is connected to the other end of the first quarter circle arc portion 210, extending toward the base plate 100 and a little shorter than the first quarter circle arc portion 221. That is, the distal end portion of 221 of the second quarter circle arc portion 220 is opposite the base plate 100. A contact terminal 230 as a projection brought into contact with an electrode 10 of a measurement objective B is provided at the top portion of the arch type probe 200.

For example, PCB or the like is used as the base plate 100. Printed wirings not shown are formed on a surface of the base plate. An external electrode not shown is provided on the base plate 100 at the edge portion thereof. The external electrode is connected electrically to one ends of the first quarter circle arc portions 210 through the printed wirings.

An reinforcing member 300 is an elastic resin having an elasticity higher than an arch type probe 200, provided in a clearance between a base plate 100 and a surface of the arch type probe on the other side thereof from the top portion thereof, which probe is brought into contact with an electrode 10 of a measurement objective B, for example an elastomer or the like. The reinforcing member 300 is interposed in the clearance in a fabrication process of the arch type probes 200.

A probe card A with such a construction is mounted to the prober of a measuring instrument as described above and used for measurement of an electric characteristics of a measurement objective B. Detailed information will be given of a usage method thereof below. Note that a tester of the measuring instrument and the probe card A are connected electrically to each other through the external electrode.

First off, a driving apparatus for the prober is activated so as to cause the base plate 100 and the measurement objective B to move relatively close to each other. Such a movement brings the contact terminals 230 of the arch type probes 200 and the corresponding electrodes 10 of the measurement objective 10 into contact with each other. Thereafter, the base plate 100 and the measurement objective B are moved closer to each other to thereby press the contact terminals 230 against the corresponding electrodes 10 of the measurement objective B (that is, overdriven).

At this time, an arch type probe 200 is elastically deformed, in parallel thereto, the distal end portion 221 of the second quarter circle arc portion 220 is, as shown in FIG. 2, brought into contact with a surface of the base plate 100 and thereafter, the distal end portion thereof moves on the surface of the base plate 100 (in a direction of an arrow mark of FIG. 1). A reinforcing member 300 is elastically deformed and absorbs a load imposed on the arch type probe 200 by overdriving.

In a case where such a probe card A is employed, an arch type probe 200 is elastically deformed and in parallel thereto, the distal end portion 221 of a second quarter circle arc portion 220 is brought into contact with a surface of a base plate 100 and thereafter, the distal end portion 221 is caused to move on the surface of a base plate 100, thereby enabling a load caused by overdriving imposed on the arch type probe 200 to be dispersed. With contact of the distal end portion 221 of the second quarter circle arc portion 220 with the base plate 100, it is also possible to secure a predetermined contact pressure required for electric conduction between the arch type probe 200 and the corresponding electrode 10 and a predetermined scrubbing distance (that is, a distance over which the distal end portion 221 of the second quarter circle arc portion 220 slides on a surface of the electrode 10 of the measurement objective B) since the contact terminal 230 slides on the electrode 10 due to elastic deformation of the arch type probe 200.

Any design change may be conducted on an arch type probe 200 without causing any problem as far as it is a probe in the shape of a half circle arc, formed on and supported at one end thereof by a surface of a base plate 100 of a probe card, having a first quarter circle arc portion 210 which is supported at one end thereof by the base plate 100 and a second quarter circle arc portion 220 connected to the other end of the first quarter circle arc portion 210 and a little shorter than the first quarter circle arc 210, wherein the top portion of the probe 200 located at almost the center of the probe serves as a contact surface brought into contact with an electrode 10 of the measurement objective B.

The distal end portion 221 of a second quarter circle arc portion 220 of an arch type probe 200 is shaped to be a sphere as shown in FIG. 3, thereby enabling a friction coefficient between the distal end portion 221 and a surface of the base plate 100 to be reduced. With the distal end portion in the shape of a sphere adopted, the distal end portion 221 slides on the surface of the base plate 100 with ease; therefore, enabling dispersion of a load caused by overdriving to be improved.

The distal end surface of the distal end portion 221 may be coated with a material necessary for reducing a friction coefficient between a surface of the base plate and the distal end surface of the distal end portion 221, for example Teflon (a registered trade mark), ethylene or the like instead of adopting the end portion 221, in the shape of a sphere, of the second quarter circle arc portion 220.

In order to increase a strength of an arch type probe 200, the arch type probe 200 can also be made so as to include a material necessary for raising a Young's modulus, for example nickel cobalt, manganese, tungsten, rhenium tungsten or the like. Note that it is not necessarily forced to provide a contact terminal 230 at the top portion of an arch type probe 200.

Any member can be employed as a base plate 100 as far as it is a plate on which arch type probes 200 as described above can be formed and any change in design is allowed. For example, coating can also be applied, as shown with a dotted line in FIG. 1, on a portion of a surface of a base plate 100 opposite the distal end portion 221 of a second quarter circle arc portion 220 with a material necessary for reducing a friction coefficient between a surface of the base plate 100 and the distal end surface of the distal end portion 221 of the second quarter circle arc portion 220, for example a resin such as Teflon (a registered trade mark), ethylene or the like. Note that for example, a sheet member can also be used instead of the base plate 100.

A reinforcing member 300 may be obtained in a way such that a reinforcing member such as alumina with an elasticity higher than the probe 220 is formed integrally with the arch type probe on a back surface thereof along the length direction in a fabrication process as shown in FIG. 4 to thereby, form the arch type probe 200 in a multilayer structure for reinforcement. Note that needless to say that it is not necessary forced to provide a reinforcing member 300.

What is claimed is:

1. A probe card comprising:
   a base plate; and
   a probe being a member in a shape of a half circle arc, formed on and supported at one end thereof by a surface of the base plate and having a top portion located at almost the center of the probe serving as a contact surface for contacting with an electrode of a measurement objective wherein
   the probe has a first quarter circle arc portion which is supported at one end thereof by the base plate and a second quarter circle arc portion which is connected to the other end of the first quarter circle arc portion and a little shorter than the first quarter circle arc portion, and the top portion of the probe is brought into contact with an electrode of the measurement objective and elastically deformed and thereby a distal end of said second quarter arc portion is brought into contact with said base plate and slides.

2. A probe card according to claim 1, wherein a projected contact terminal is provided at the top portion of said probe.

3. A probe card according to claim 1, wherein the distal end portion of the second quarter circle arc portion of said probe is spherical.

4. A probe card according to claim 1, wherein coating is applied on the distal end surface of the distal end portion of the second quarter circle arc portion.

5. A probe card according to claim 1, wherein a material necessary for raising a Young's modulus is incorporated into said probe.

6. A probe card according to any of claims 1 to 5, wherein coating is applied on a portion of a surface of the base plate in contact with the distal end surface of the second quarter circle arc portion.

7. A probe card according to any of claims 1 to 5, wherein a reinforcing member with an elasticity higher than the probe and is provided integrally with the probe on a surface thereof facing the base plate along the length direction.

8. A probe card according to any of claims 1 to 5, wherein a reinforcing member with an elasticity higher than the probe is provided between the base plate and a surface of the probe on the other side thereof from the top portion thereof.

* * * * *